United States Patent
Takamura et al.

(10) Patent No.: US 11,756,593 B2
(45) Date of Patent: Sep. 12, 2023

(54) MEMORY CONTROL CIRCUIT, INFORMATION PROCESSING SYSTEM, AND MEMORY CONTROL METHOD

(71) Applicant: CANON KABUSHIKI KAISHA, Tokyo (JP)

(72) Inventors: Akihiro Takamura, Tokyo (JP); Daisuke Shiraishi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/718,796

(22) Filed: Apr. 12, 2022

(65) Prior Publication Data
US 2022/0335990 A1    Oct. 20, 2022

(30) Foreign Application Priority Data
Apr. 14, 2021    (JP) .................................. 2021-068311

(51) Int. Cl.
*G11C 7/10*    (2006.01)

(52) U.S. Cl.
CPC .......... *G11C 7/1048* (2013.01); *G11C 7/1063* (2013.01); *G11C 7/1069* (2013.01); *G11C 7/1096* (2013.01)

(58) Field of Classification Search
CPC ... G11C 7/1048; G11C 7/1063; G11C 7/1069; G11C 7/1096
See application file for complete search history.

(56) References Cited

U.S. PATENT DOCUMENTS

| | | | | |
|---|---|---|---|---|
| 7,187,572 B2* | 3/2007 | Perego | ................. | G11C 7/1087 365/220 |
| 7,216,182 B2* | 5/2007 | Henkel | ............... | G06F 13/1605 710/33 |
| 7,284,077 B2* | 10/2007 | Duncan | ................. | G06F 13/385 710/52 |
| 7,386,658 B2* | 6/2008 | Rotithor | .............. | G06F 12/0607 711/108 |
| 8,266,383 B1* | 9/2012 | Minkin | ................. | G06F 12/084 710/39 |
| 2018/0232178 A1 | 8/2018 | Iwaki | | |

FOREIGN PATENT DOCUMENTS

JP    2017054483 A    3/2017

* cited by examiner

*Primary Examiner* — Vanthu T Nguyen
(74) *Attorney, Agent, or Firm* — Canon U.S.A., Inc. IP Division

(57) ABSTRACT

A memory control circuit includes an access storage unit configured to store access requests for a memory, a status management unit configured to, based on the access requests stored in the access storage unit, perform priority access type switching between two access types obtained by classifying the access requests, and an access selection unit configured to select and execute an access request stored in the storage unit. The access selection unit performs, if the priority access type switching is in progress and there is time for executing an access request of a priority access type before the priority access type switching, selecting the access request of the priority access type before the priority access type switching, and if the priority access type switching is not in progress, selecting an access request of the priority access type.

15 Claims, 10 Drawing Sheets

MEMORY CONTROL CIRCUIT, INFORMATION PROCESSING SYSTEM, AND MEMORY CONTROL METHOD

BACKGROUND

Field of the Disclosure

The present disclosure relates to a memory control circuit, an information processing system, and a memory control method.

Description of the Related Art

A dynamic random access memory (DRAM) is typically used as a main storage device of computer systems. With the increase in functional and performance sophistication of computer systems, performance requirements for the DRAM are also increasing. Example factors of performance degradation of the DRAM include a page miss and a switching between a read operation and a write operation. There have been proposed various techniques for preventing such performance degradation of a memory control circuit.

For example, Japanese Patent Application Laid-Open No. 2017-54483 discusses a technique for preventing performance degradation caused by a switching between a read operation and a write operation. The technique discussed in Japanese Patent Application Laid-Open No. 2017-54483 prevents performance degradation by taking out all of access requests of the priority access type (read or write access) from a command queue and then performing the priority access type switching.

At the time of the priority access type switching, a page miss of the DRAM may prevent the execution of the access request of the priority access type after the switching. While an access request after the switching cannot be executed, the access request of the priority access type before the switching may be executable, possibly resulting in performance degradation of the DRAM.

SUMMARY

Some embodiments of the present disclosure are directed to preventing performance degradation of a memory by suitably executing an access request for the memory at the time of the priority access type switching.

According to an aspect of the present disclosure, a memory control circuit includes a storage unit configured to store at least one access request for a memory, a first status management unit configured to, based on access requests stored in the storage unit, perform priority access type switching between two access types obtained by classifying the access requests, and an access selection unit configured to select and execute an access request stored in the storage unit. The access selection unit performs, if the priority access type switching is in progress and there is time for executing an access request of a priority access type before the priority access type switching, selecting the access request of the priority access type before the priority access type switching, and if the priority access type switching is not in progress, selecting an access request of the priority access type.

Further features of various embodiments will become apparent from the following description of exemplary embodiments with reference to the attached drawings.

DESCRIPTION OF THE EMBODIMENTS

Exemplary embodiments of the present disclosure will be described below with reference to the accompanying drawings.

Figure 1:
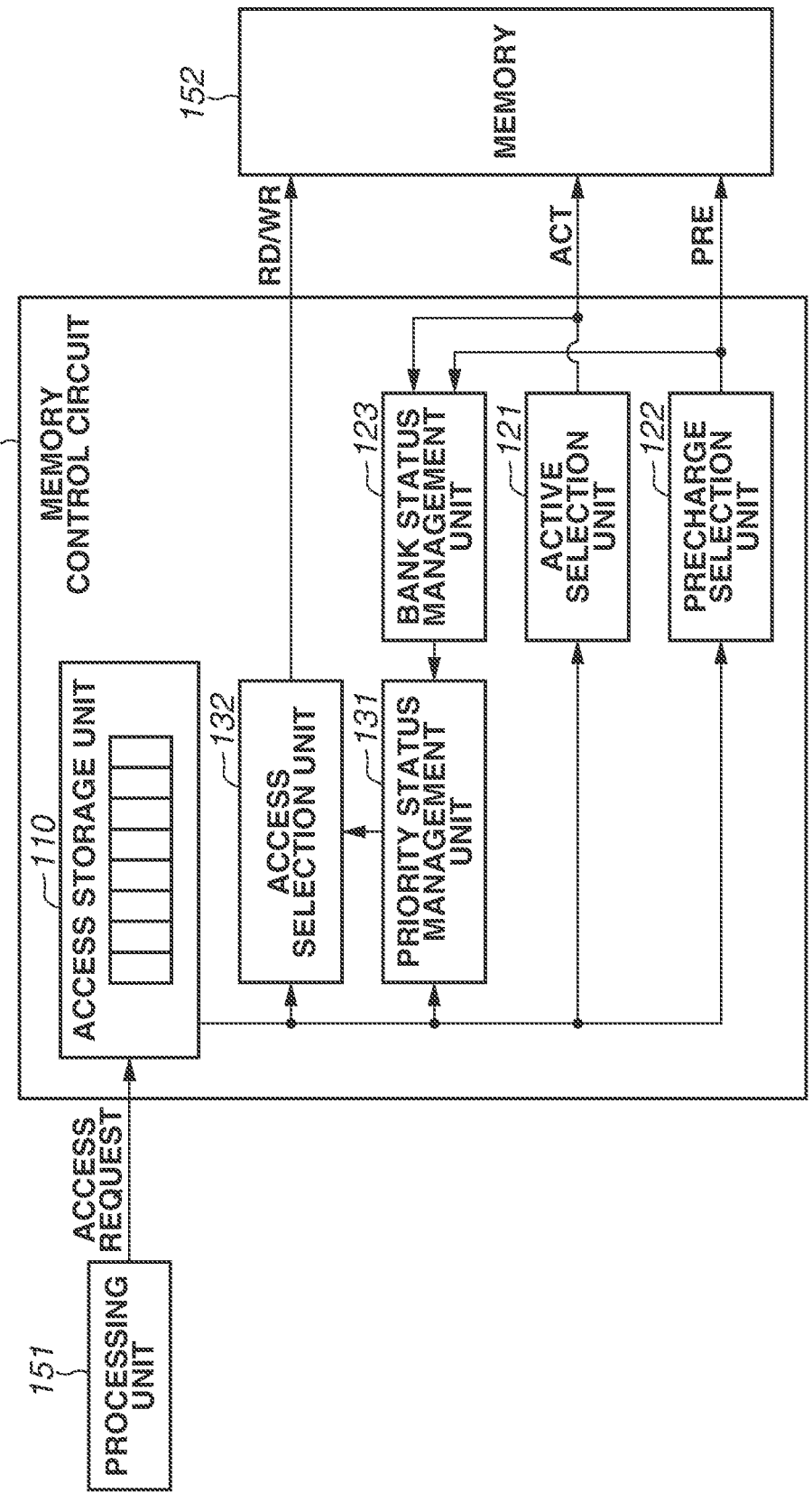
FIG. 1 illustrates an example configuration of an information processing system using a memory control circuit according to the present exemplary embodiments.

FIG. 1 is a block diagram illustrating an example configuration of an information processing system (computer system) using a memory control circuit according to an exemplary embodiment. The information processing system includes a memory control circuit 100, a processing unit 151, and a memory 152. The memory control circuit 100 receives an access request for the memory 152 issued by the processing unit 151.

The memory control circuit 100 selects an arbitrary access request from among received access requests and issues a command to the memory 152 based on the selected access request. The processing unit 151 is, for example, a calculation processing apparatus (processor), such as a central processing unit (CPU), and issues an access request to the memory 152. The memory 152, e.g., a dynamic random access memory (DRAM), performs an operation in response to an access request based on a command from the memory control circuit 100. The memory 152 is not limited to a DRAM but may be other memory, such as a flash memory.

The memory control circuit 100 includes an access storage unit 110, an active selection unit 121, a precharge selection unit 122, a bank status management unit 123, a priority status management unit 131, and an access selection unit 132. The access storage unit 110 receives an access request for the memory 152 issued by the processing unit 151 and stores the received access request. The access storage unit 110 can store one or more received access requests. An access request includes at least an access type (read or write access) and an address, and is given an access priority. Possible access types include not only Read and Write but also Erase that is used, for example, by the NAND FLASH® memory.

The active selection unit 121 determines which access request of access requests stored in the access storage unit 110 is to be subjected to the activation of a bank of the memory 152 and then issues an active (ACT) command to open the bank. The precharge selection unit 122 determines which access request of access requests stored in the access storage unit 110 to be subjected to the precharge of a bank of the memory 152, and then issues a precharge (PRE) command to close the bank. The bank status management unit 123 monitors the issuance of an active command and a precharge command and manages the status of each bank of the memory 152.

The priority status management unit 131 determines which of the two different access types (read and write access types) is to be the priority access type based on an access request stored in the access storage unit 110 and a bank status managed by the bank status management unit 123. The access selection unit 132 determines which access request of access requests stored in the access storage unit 110 is to be subjected to a read or write access based on the priority access type, and issues a read (RD) command or a (WR) write command.

Figure 2:
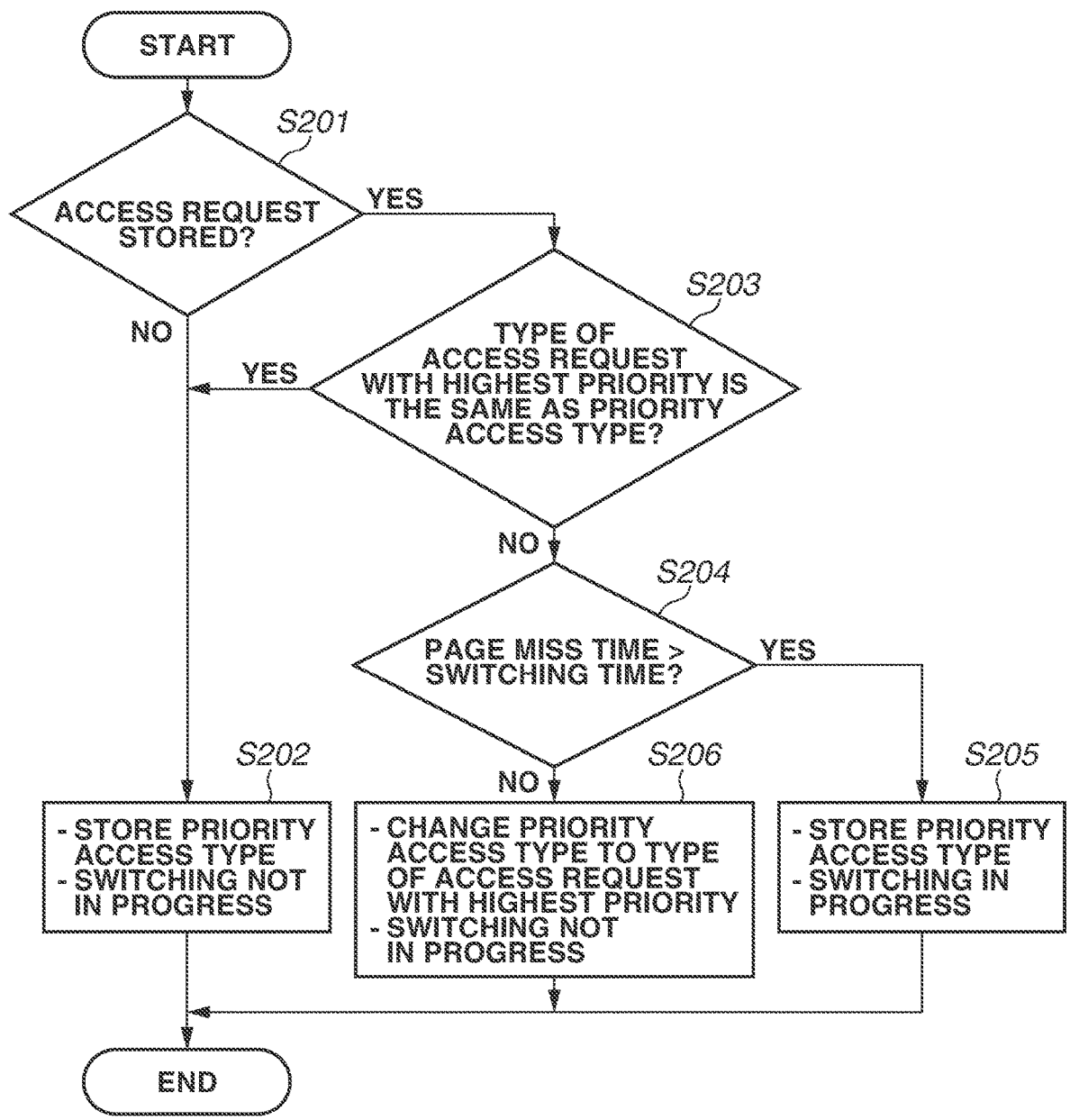
FIG. 2 is a flowchart illustrating an example of processing of a priority status management unit according to a first exemplary embodiment.

FIG. 2 is a flowchart illustrating an example of processing performed by the priority status management unit 131 to determine the priority access type. The priority status management unit 131 determines the priority access type according to the flowchart illustrated in FIG. 2 in each cycle. The priority access type in the initial state is a read access.

In step S201, the priority status management unit 131 determines whether any access request is stored in the access storage unit 110. If the priority status management unit 131 determines that no access request is stored in the access storage unit 110 (NO in step S201), the processing proceeds to step S202. In contrast, if the priority status management unit 131 determines that an access request is stored in the access storage unit 110 (YES in step S201), the processing proceeds to step S203.

In step S202, the priority status management unit 131 stores the priority access type and determines that the switching is not in progress. Then, the processing exits the flowchart.

In step S203, the priority status management unit 131 determines whether the type of the access request with the highest priority out of access requests stored in the access storage unit 110 is the same as the priority access type. If the access request with the highest priority is present in both the read and write access types, the priority status management unit 131 determines that the type of the access request with the highest priority is the same as the priority access type. If the both the type of the access request with the highest priority and the priority access type are the read access type and if both the type of the access request with the highest priority and the priority access type are the write access type, the priority status management unit 131 determines that the type of the access request with the highest priority is the same as the priority access type. In other cases, the priority status management unit 131 determines that the type of the access request with the highest priority is different from the priority access type. If the priority status management unit 131 determines that the type of the access request with the highest priority is the same as the priority access type (YES in step S203), the processing proceeds to step S202. In contrast, if the priority status management unit 131 determines that the type of the access request with the highest priority is different from the priority access type (NO in step S203), the processing proceeds to step S204.

In step S204, the priority status management unit 131 compares the page miss time with the switching time and determines whether the page miss time is longer than the switching time. The page miss time refers to a time period before the issuance of a read command or a write command for the access request with the highest priority out of access requests stored in the access storage unit 110: the page miss time is calculated based on the bank status managed by the bank status management unit 123. If there is a plurality of read or write commands for the access request with the highest priority out of access requests stored in the access storage unit 110, the priority status management unit 131 targets the read command or write command with the shortest page miss time. The switching time refers to a time period required to switch the access type defined by the specification of the memory 152 from the read access to the write access or from the write access to the read access. If the access request with the highest priority out of access requests stored in the access storage unit 110 is a read access, the time period required to switch the access type from the write access to the read access is referred to as the switching time. If the access request with highest priority out of access requests stored in the access storage unit 110 is a write access, the time period required to switch the access type from the read access to the write access is referred to as the switching time.

When the page miss time is longer than the switching time, another write access can be executed before the issuance of a read command for the access request with the highest priority out of access requests stored in the access storage unit 110. Likewise, when the page miss time is longer than the switching time, another read access can be executed before the issuance of a write command for the access request with the highest priority out of access requests stored in the access storage unit 110. If the priority status management unit 131 determines that the page miss time is longer than the switching time (YES in step S204), the processing therefor proceeds to step S205. In contrast, if the priority status management unit 131 determines that the page miss time is shorter than or equal to the switching time (NO in step S204), the processing proceeds to step S206.

In step S205, the priority status management unit 131 stores the priority access type and determines that the switching is in progress. Then, the processing exits the flowchart.

In step S206, the priority status management unit 131 switches the priority access type to the type of the access request with the highest priority out of access requests stored in the access storage unit 110, and determines that the switching is not in progress. Then, the processing exits the flowchart.

The priority status management unit 131 determines the priority access type according to the flowchart illustrated in FIG. 2 in each cycle. Even if the switching is determined to be in progress in the preceding cycle, and if the type of the access request with the highest priority out of access requests stored in the access storage unit 110 is the same as the priority access type, the priority status management unit 131 therefore stores the priority access type and then determines, in step S202, that the switching is not in progress. In this case, the priority status management unit 131 stops the priority access type switching.

Figure 3:
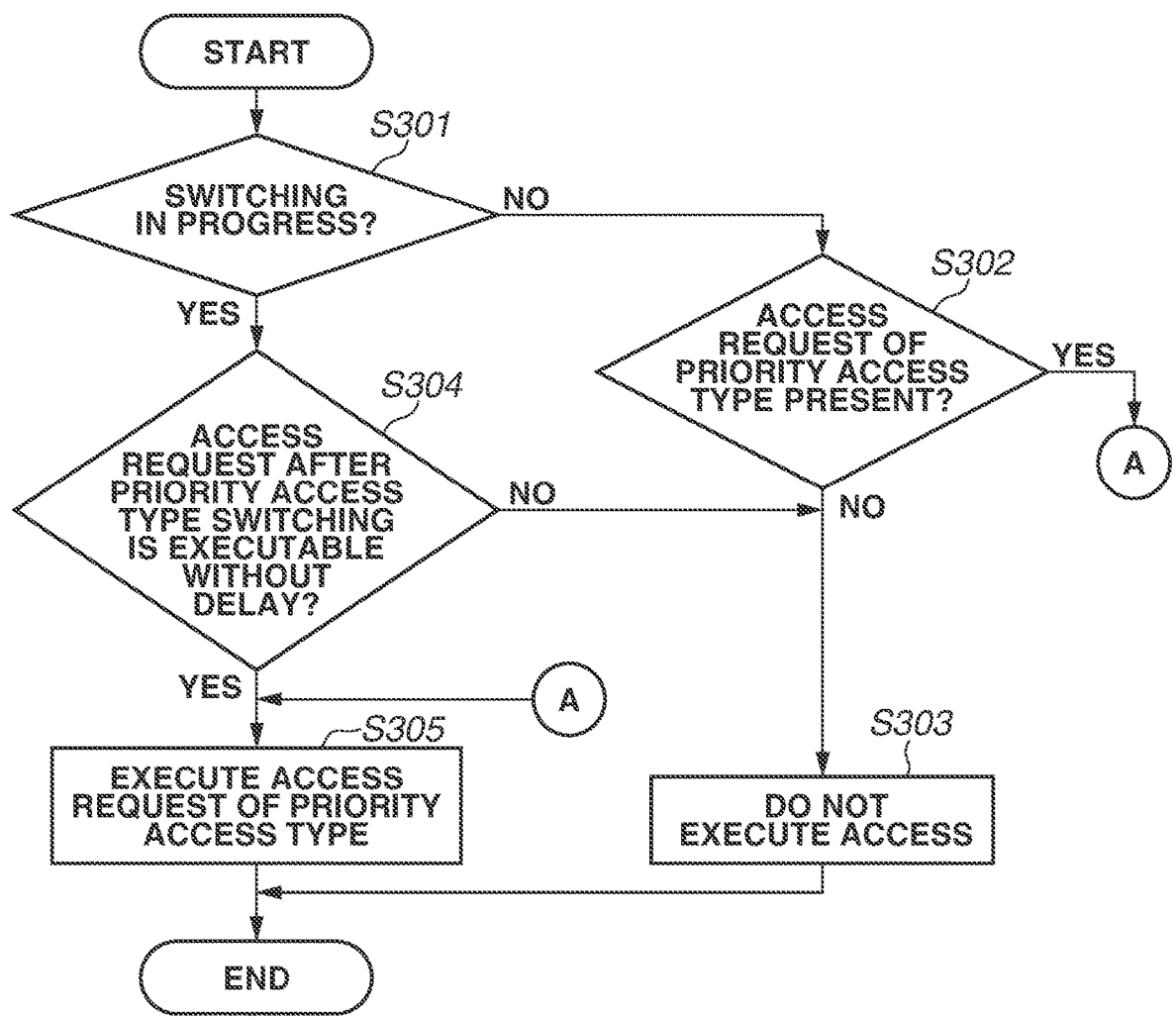
FIG. 3 is a flowchart illustrating an example of processing of an access selection unit according to the first exemplary embodiment.

FIG. 3 is a flowchart illustrating an example of processing performed by the access selection unit 132 to determine the access request to be executed. The access selection unit 132 determines the access request to be executed according to the flowchart illustrated in FIG. 3 in each cycle.

In step S301, the access selection unit 132 determines whether the switching is in progress. The access selection unit 132 can determine whether the switching is in progress based on the flowchart illustrated in FIG. 2. If the access selection unit 132 determines that the switching is not in progress (NO in step S301), the processing proceeds to step S302. In contrast, if the access selection unit 132 determines that the switching is in progress (YES in step S301), the processing proceeds to step S304.

In step S302, the access selection unit 132 determines whether the access request of the priority access type is present in access requests stored in the access storage unit 110. If the access selection unit 132 determines that no access request of the priority access type is present (NO in step S302), the processing proceeds to step S303. In step S303, the access selection unit 132 does not execute the access request. Then, the processing exits the flowchart. In contrast, if the access selection unit 132 determines that the access request of the priority access type is present (YES in step S302), the processing proceeds to step S305.

In step S304, the access selection unit 132 determines whether the access request of the priority access type after the priority access type switching can be executed without a delay even if the access request of the priority access type is executed. The access selection unit 132 firstly determines whether the access request of the priority access type is present in the access storage unit 110. If the access request of the priority access type is present, the access selection unit 132 determines, upon execution of the access request, whether the access request of the priority access type after the switching can be executed without an execution timing delay, based on the bank status managed by the bank status management unit 123. If the access selection unit 132 determines that, even after the access request of the priority access type is executed, the access request of the priority access type after the switching can be executed without a delay (YES in step S304), the processing proceeds to step S305. In contrast, if the access selection unit 132 determines that, after the access request of the priority access type is executed, the access request of the priority access type after the switching cannot be executed without a delay (NO in step S304), the processing proceeds to step S303.

In step S305, the access selection unit 132 selects and executes the access request of the priority access type out of access requests stored in the access storage unit 110.

Figure 4:
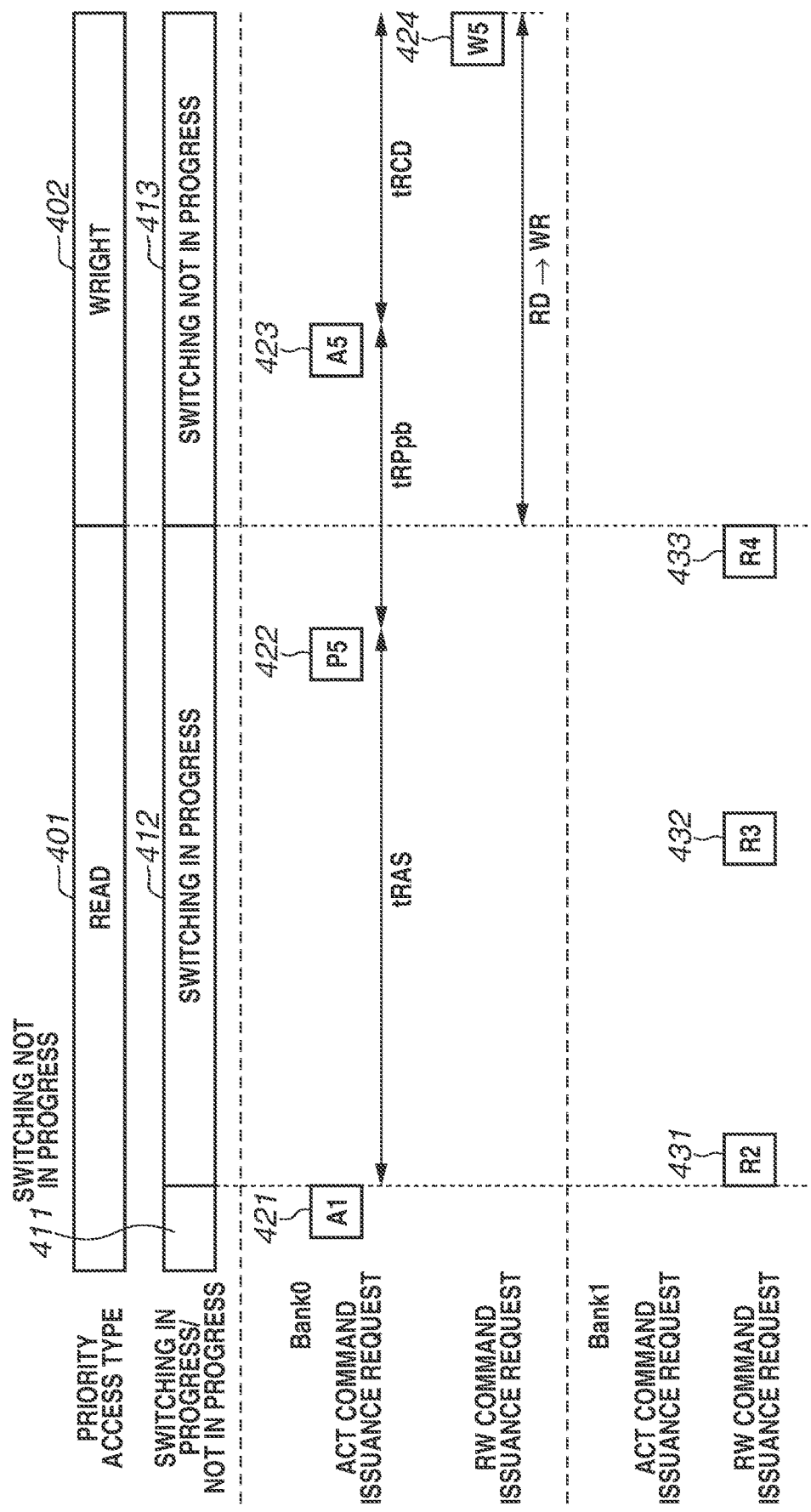
FIG. 4 illustrates an operation of a memory control circuit according to the first exemplary embodiment.
Figure 5:
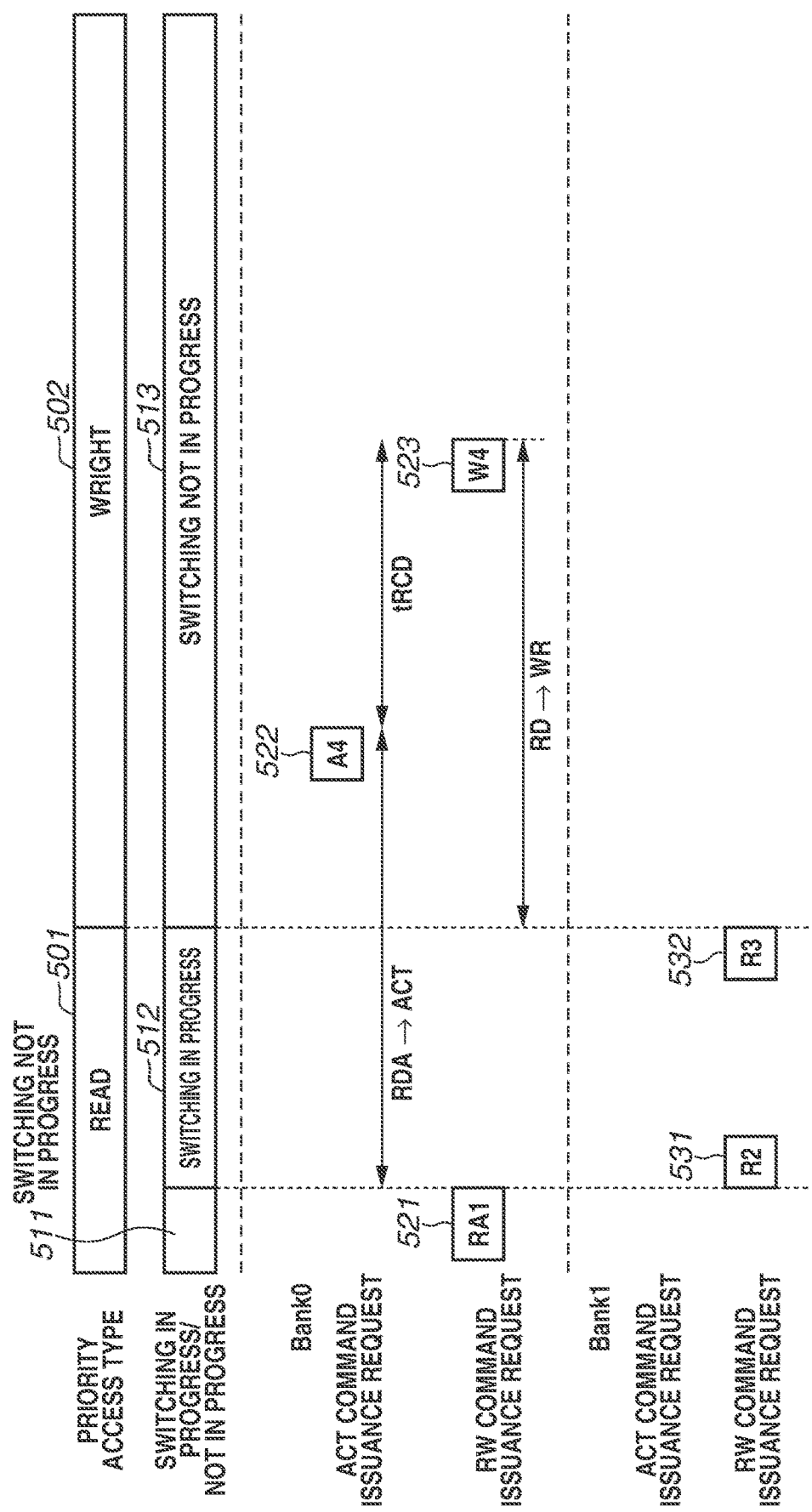
FIG. 5 illustrates another operation of the memory control circuit according to the first exemplary embodiment.
Figure 6:
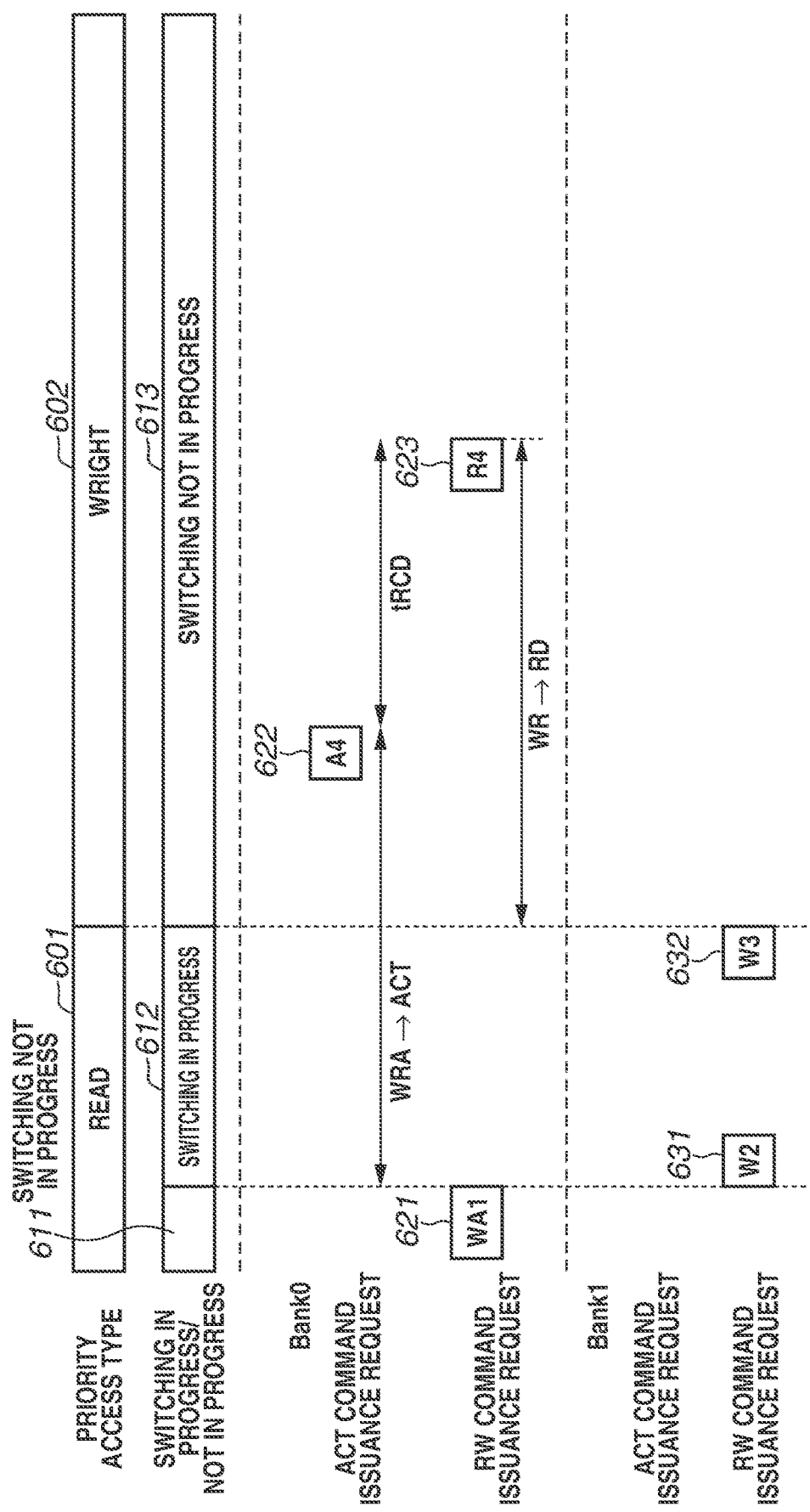
FIG. 6 illustrates still another operation of the memory control circuit according to the first exemplary embodiment.

Operations of the memory control circuit 100 according to the present exemplary embodiment will now be described with reference to FIGS. 4 to 6. FIGS. 4 to 6 illustrate the issuance of the following commands for two different banks (Bank 0 and Bank 1) of the memory 152:

Active command (ACT command) (An)
  Precharge command (PRE command) (Pn)
  Read/write command (RD command/WR command) (Rn and Wn)
  Read with auto-precharge command (RDA command) (RDAn)
  Write with auto-precharge command (WRA command) (WRAn), where n denotes the access number.

FIG. 4 illustrates an example of an operation of the memory control circuit 100. In this example, access requests for read accesses 1 to 4 with a low priority are stored in the access storage unit 110 in the initial state, and thereafter, an access request for a write access 5 with a high priority is received. Table 1 illustrates the access number, bank number, access type, and priority for each access in this example.

In the initial state, the priority access type is a read access 401, and the active selection unit 121 has issued an ACT command 421 for an access 1.

TABLE 1

| Access No. | Bank No. | Access type | Priority |
|---|---|---|---|
| 1 | Bank 0 | Read | Low |
| 2 | Bank 1 | Read | Low |
| 3 | Bank 1 | Read | Low |
| 4 | Bank 1 | Read | Low |
| 5 | Bank 0 | Write | High |

Upon reception of an access request for the write access 5 with a high priority, the priority status management unit 131 determines the priority access type. The priority status management unit 131 determines the priority access type according to the flowchart illustrated in FIG. 2. In this example, the priority status management unit 131 determines that the type of the access request with the highest priority is different from the priority access type. The priority status management unit 131 further determines that the page miss time is longer than the switching time and that the switching is in progress. Subsequently, the priority status management unit 131 determines the access request to be executed by the access selection unit 132 according to the flowchart illustrated in FIG. 3. In this example, the access 5 of the priority access type can be executed without an execution timing delay after the priority access type switching. Even if an access 2 of the priority access type stored in the access storage unit 110 is executed in a state 412 where the switching is in progress, the access 5 of the priority access type can be executed without an execution timing delay after the priority access type switching. Thus, a read access of the priority access type is executed. In this example, the access selection unit 132 selects and executes an access request 431 for the read access 2 of the priority access type for Bank 1. Likewise, in the state 412 where the switching is in progress, the access selection unit 132 selects and executes access requests 432 and 433 for read accesses 3 and 4 of the priority access type for Bank 1.

When the page miss time becomes shorter than or equal to the switching time as time advances, the priority status management unit 131 determines that the state 412 where the switching is in progress has changed to the state 413 where the switching is not in progress, and switches the priority access type to a write access 402. Access 5 as the access request with the highest priority out of access requests stored in the access storage unit 110 is a write access. Thus, in order to execute the access request for the write access 5, the precharge selection unit 122 issues a PRE command 422 for Bank 0 when it can be issued. The active selection unit 121 issues an ACT command 423 when it can be issued. Thereafter, when the priority access type becomes the write access 402 and the switching time has elapsed, the access selection unit 132 selects and executes an access request 424 for the write access 5 with the highest priority out of access requests stored in the access storage unit 110.

As in this example, at the time of the priority access type switching, the access request of the priority access type cannot be executed after the switching because of a page miss of the memory 152. However, the access request of the priority access type may be executed before the switching. In this example, access requests 431 to 433 can be executed. In contrast, when there is no state where the switching is in progress, and the access request of the priority access type is to be executed, the access requests 431 to 433 cannot be executed. Thus, the present exemplary embodiment makes it possible to suitably execute an access request for the memory 152 and prevent performance degradation due to a page miss of the memory 152 to a further extent than a conventional memory control circuit.

FIG. 5 illustrates another example of an operation of the memory control circuit 100. In this example, access requests for read accesses 1 to 3 with a low priority are stored in the access storage unit 110 in the initial state, and then an access request for a write access 4 with a high priority is received. Table 2 illustrates the access number, bank number, access type, and priority for each access in this example. In the initial state, the priority access type is a read access 501, and the access selection unit 132 has issued an RDA command 521 for the access 1.

TABLE 2

| Access No. | Bank No. | Access type | Priority |
|---|---|---|---|
| 1 | Bank 0 | Read | Low |
| 2 | Bank 1 | Read | Low |
| 3 | Bank 1 | Read | Low |
| 4 | Bank 0 | Write | High |

Upon reception of an access request for the write access 4 with a high priority, the priority status management unit 131 determines the priority access type. The priority status management unit 131 then determines the priority access type according to the flowchart illustrated in FIG. 2. In this example, the priority status management unit 131 determines that the type of the access request with the highest priority is different from the priority access type. The priority status management unit 131 further determines that the page miss time is longer than the switching time, and determines that the switching is in progress. Subsequently, the priority status management unit 131 determines the access request to be executed by the access selection unit 132 according to the flowchart illustrated in FIG. 3. In this example, the access 4 of the priority access type can be executed without an execution timing delay after the priority access type switching. Even when the access 2 of the priority access type stored in the access storage unit 110 is executed in a state 512 where the switching is in progress, the access 4 of the priority access type can be executed without an execution timing delay after the priority access type switching. Thus, the read access of the priority access type is executed. In this example, the access selection unit 132 selects and executes an access request 531 for the read access 2 of the priority access type for Bank 1. Likewise, in the state 512 where the switching is in progress, the access selection unit 132 selects and executes an access request 532 for a read access 3 of the priority access type for Bank 1.

When the page miss time becomes shorter than or equal to the switching time as time advances, the priority status management unit 131 determines that the state 512 where the switching is in progress has changed to the state 513 where the switching is not in progress, and switches the priority access type to a write access 502. Access 4 as the access request with the highest priority out of access requests stored in the access storage unit 110 is a write access. Thus, in order to execute the access request for the write access 4, the active selection unit 121 issues an ACT command 522 for Bank 0 when it can be issued. Thereafter, when the priority access type becomes a write access 502 and the switching time has elapsed, the access selection unit 132 selects and executes an access request 523 for the write access 4 with the highest priority out of access requests stored in the access storage unit 110.

As in this example, at the time of the priority access type switching, the access request of the priority access type cannot be executed after the switching because of a page miss of the memory 152. However, the access request of the priority access type may be executed before the switching. In this example, the access requests 531 and 532 can be executed. In contrast, when there is no state where the switching is in progress, and the access request of the priority access type is to be executed, the access requests 531 and 532 cannot be executed. Thus, the present exemplary embodiment makes it possible to suitably execute an access request for the memory 152 and prevent performance degradation due to a page miss of the memory 152 to a further extent than the conventional memory control circuit.

FIG. 6 illustrates another example of an operation of the memory control circuit 100. In this example, access requests for the write accesses 1 to 3 with a low priority are stored in the access storage unit 110 in the initial state, and then an access request for the read access 4 with a high priority is received. Table 3 illustrates the access number, bank number, access type, and priority for each access in this example. In the initial state, the priority access type is a write access 601, and the access selection unit 132 has issued a WRA command 621 for the access 1.

TABLE 3

| Access No. | Bank No. | Access type | Priority |
|---|---|---|---|
| 1 | Bank 0 | Write | Low |
| 2 | Bank 1 | Write | Low |
| 3 | Bank 1 | Write | Low |
| 4 | Bank 0 | Read | High |

Upon reception of an access request for the read access 4 with a high priority, the priority status management unit 131 determines the priority access type. The priority status management unit 131 determines the priority access type according to the flowchart illustrated in FIG. 2. In this example, the priority status management unit 131 determines that the type of the access request with the highest priority is different from the priority access type. The priority status management unit 131 further determines that the page miss time is longer than the switching time and that the switching is in progress. Subsequently, the priority status management unit 131 determines the access request to be executed by the access selection unit 132 according to the flowchart illustrated in FIG. 3. In this example, the access 4 of the priority access type can be executed without an execution timing delay after the priority access type switching. Even when the access 2 of the priority access type stored in the access storage unit 110 is executed in a state 612 where the switching is in progress, the access 4 of the priority access type can be executed without an execution timing delay after the switching. Thus, the write access of the priority access type is executed. In this example, the access selection unit 132 selects and executes an access request 631 for the write access 2 of the priority access type for Bank 1. Likewise, in the state 612 where the switching is in progress, the access selection unit 132 selects and executes an access request 632 for a write access 3 of the priority access type for Bank 1.

When the page miss time becomes shorter than or equal to the switching time as time advances, the priority status management unit 131 determines that the state 612 where the switching is in progress has changed to the state 613 where the switching is not in progress, and switches the priority access type to a read access 602. Access 4 as the access request with the highest priority out of access requests stored in the access storage unit 110 is a read access.

Thus, in order to execute the access request for the access 4, the active selection unit 121 issues an ACT command 622 for Bank 0 when it can be issued. Thereafter, when the priority access type becomes the read access 602 and the switching time has elapsed, the access selection unit 132 selects and executes an access request 623 for the access 4 with the highest priority out of access requests stored in the access storage unit 110.

As in this example, at the time of the priority access type switching, the access request of the priority access type cannot be executed after the switching because of a page miss of the memory 152. However, the access request of the priority access type may be executed before the switching. In this example, the accesses 631 and 632 can be executed. In contrast, when there is no state where the switching is in progress, and the access request of the priority access type is to be executed, the access requests 631 and 632 cannot be executed. Therefore, the present exemplary embodiment makes it possible to suitably execute an access request for the memory 152 and prevent performance degradation due to a page miss of the memory 152 to a further extent than the conventional memory control circuit.

Figure 7:
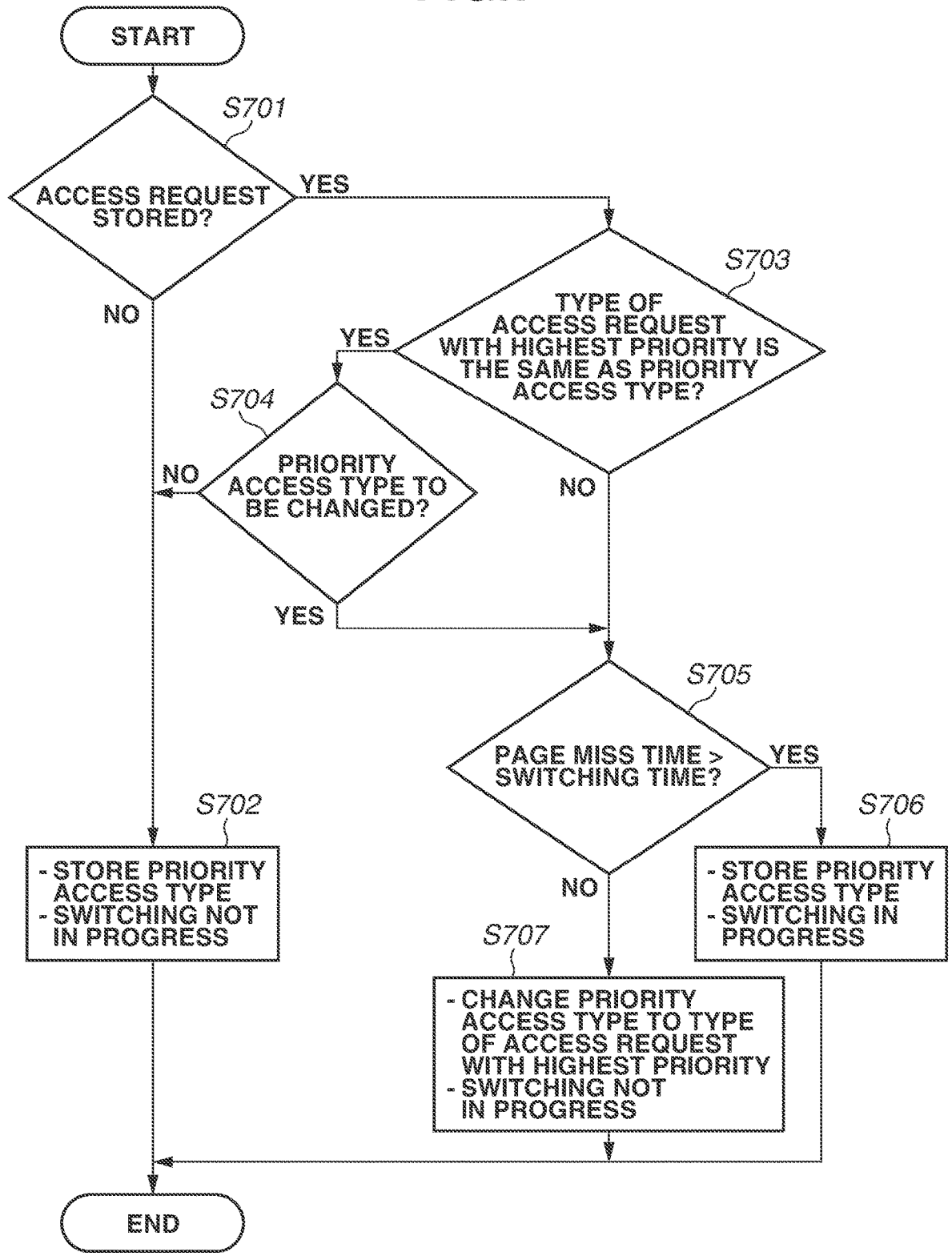
FIG. 7 is a flowchart illustrating an example of processing of a priority status management unit according to a second exemplary embodiment.

A second exemplary embodiment (described below) differs from the first exemplary embodiment in the processing performed by the priority status management unit 131 to determine the priority access type, and is similar to the first exemplary embodiment in other processing. The processing for determining the priority access type performed by the priority status management unit 131 according to a second exemplary embodiment will be described below. FIG. 7 is a flowchart illustrating an example of processing performed by the priority status management unit 131 to determine the priority access type according to the second exemplary embodiment. The priority status management unit 131 determines the priority access type according to the flowchart illustrated in FIG. 7 in each cycle.

In step S701, the priority status management unit 131 determines whether any access request is stored in the access storage unit 110. If the priority status management unit 131 determines that no access request is stored in the access storage unit 110 (NO in step S701), the processing proceeds to step S702. In contrast, if the priority status management unit 131 determines that an access request is stored in the access storage unit 110 (YES in step S701), the processing proceeds to step S703.

In step S702, the priority status management unit 131 stores the priority access type and determines that the switching is not in progress. Then, the processing exits the flowchart.

In step S703, similarly to step S203 illustrated in FIG. 2, the priority status management unit 131 determines whether the type of the access request with the highest priority out of access requests stored in the access storage unit 110 is the same as the priority access type. If the priority status management unit 131 determines that the type of the access request with the highest priority is the same as the priority access type (YES in step S703), the processing proceeds to step S704. In contrast, if the priority status management unit 131 determines that the type of the access request with the highest priority is different from the priority access type (NO in step S703), the processing proceeds to step S705.

In step S704, the priority status management unit 131 determines whether to perform the priority access type switching even if the type of the access request with the highest priority out of access requests stored in the access storage unit 110 is the same as the priority access type. If the priority status management unit 131 determines to perform the priority access type switching (YES in step S704), the processing proceeds to step S705. In contrast, if the priority status management unit 131 determines not to perform the priority access type switching (NO in step S704), the processing proceeds to step S702.

In step S705, similarly to step S204 illustrated in FIG. 2, the priority status management unit 131 compares the page miss time with the switching time to determine whether the page miss time is longer than the switching time. If the priority status management unit 131 determines that the page miss time is longer than the switching time (YES in step S705), the processing proceeds to step S706. In contrast, if the priority status management unit 131 determines that the page miss time is shorter than or equal to the switching time (NO in step S705), the processing proceeds to step S707.

In step S706, the priority status management unit 131 stores the priority access type and determines that the switching is in progress. Then, the processing exits the flowchart.

In step S707, the priority the priority status management unit 131 switches the priority access type to the type of the access request with the highest priority out of access requests stored in the access storage unit 110, and determines that the switching is not in progress. Then, the processing exits the flowchart.

Figure 8:
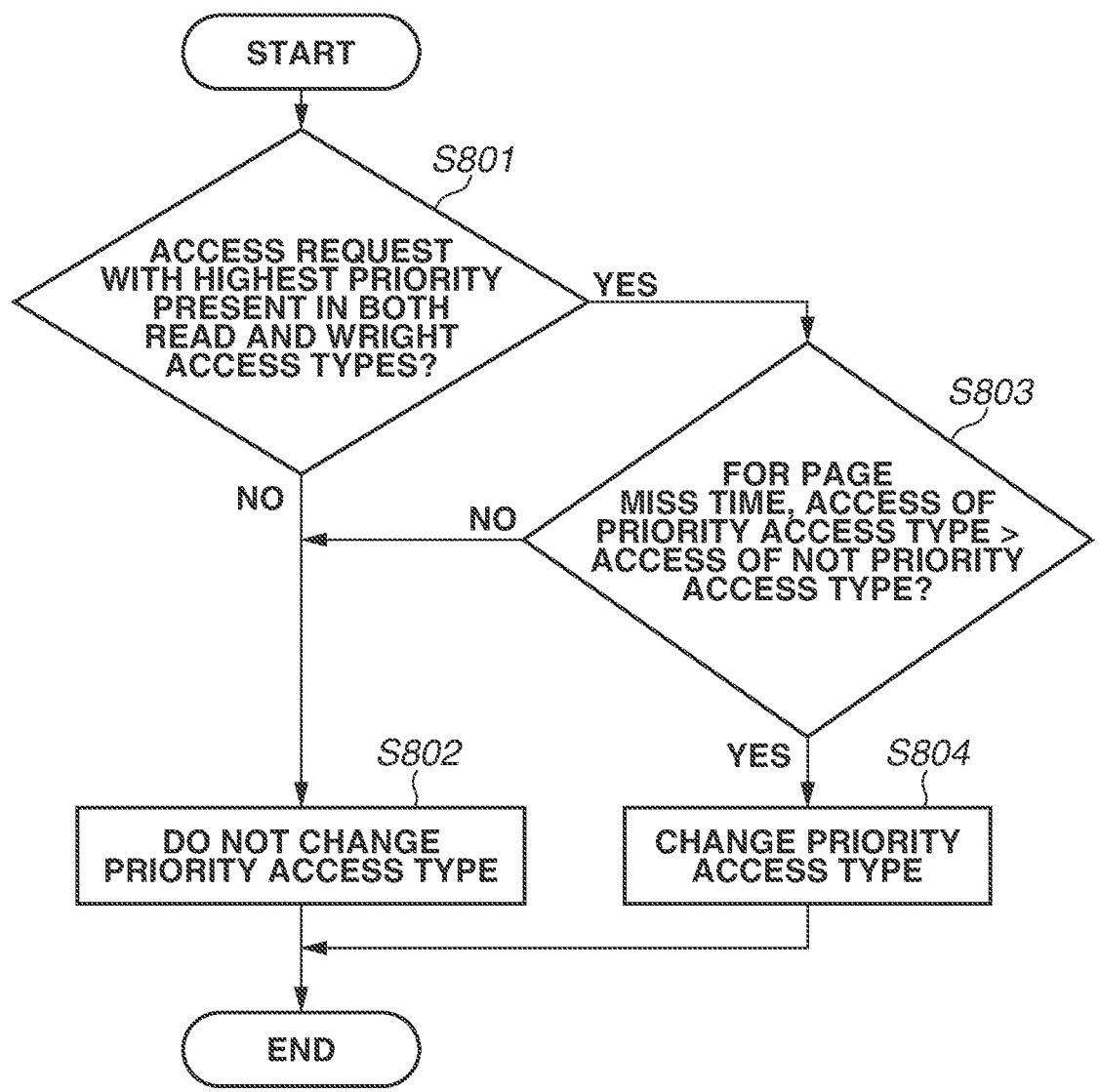
FIG. 8 is a flowchart illustrating an example of processing in step S704 in FIG. 7.

FIG. 8 is a flowchart illustrating an example of the processing in step S704 illustrated in FIG. 7.

In step S801, the priority status management unit 131 determines whether the access request with the highest priority out of access requests stored in the access storage unit 110 is present in both the read and write access types. If the priority status management unit 131 determines that the access request with the highest priority is present in either one of the read and write access types (NO in step S801), the processing proceeds to step S802. In contrast, if the access request with the highest priority is present in both read and write access types (YES in step S801), the processing proceeds to step S803.

In step S802, the priority status management unit 131 determines not to perform the priority access type switching. Then, the processing returns to the flowchart illustrated in FIG. 7.

In step S803, the priority status management unit 131 determines whether the page miss time on the access request of the priority access type is longer than the page miss time on an access request of a non-priority access type. If there is a plurality of read or write commands of the access request with the highest priority out of access requests stored in the access storage unit 110, the priority status management unit 131 subjects these read or write commands with the shortest page miss time to the comparison. If the page miss time on the access request of the priority access type is longer than the page miss time on an access request of a non-priority access type, the access request can be executed earlier by performing the priority access type switching. If the priority status management unit 131 determines that the page miss time on the access request of the priority access type is longer than the page miss time on an access request of a non-priority access type (YES in step S803), the processing proceeds to step S804. In contrast, if the priority status management unit 131 determines that the page miss time on the access request of the priority access type is shorter than or equal to the page miss time on an access request of a non-priority access type (NO in step S803), the processing proceeds to step S802.

In step S804, the priority status management unit 131 determines to perform the priority access type switching. Then, the processing returns to the flowchart illustrated in FIG. 7.

As described above, if the access request with the highest priority out of access requests stored in the access storage unit 110 is present in both the read and write access types, the priority status management unit 131 determines to perform the priority access type switching based on the page miss time for each access. If the page miss time on the access request of the priority access type is longer than the page miss time on an access request of a non-priority access type, the priority status management unit 131 performs the priority access type switching. Thus, performance degradation due to a page miss of the memory 152 can be prevented to a further extent than the conventional memory control circuit.

Figure 9:
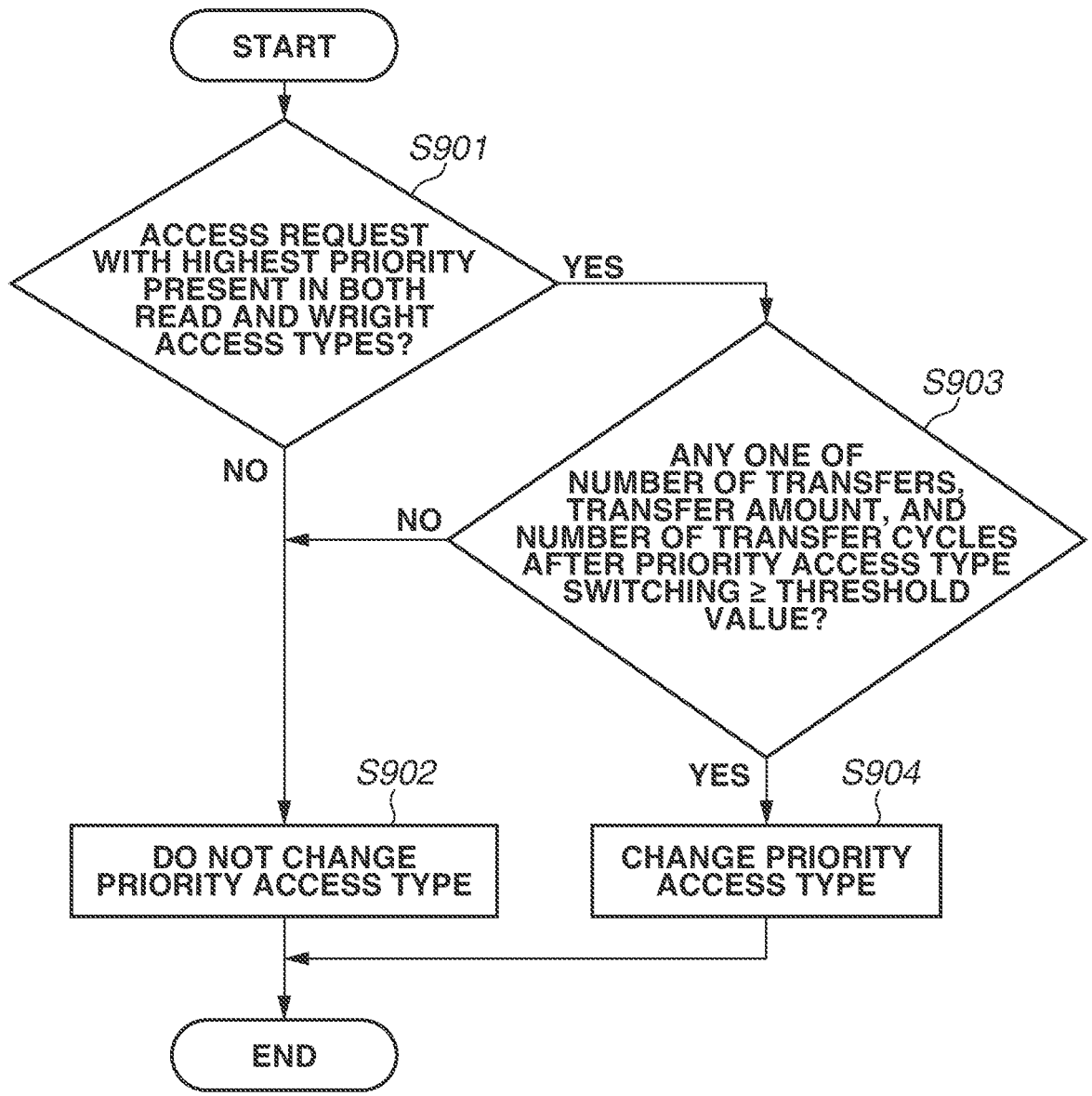
FIG. 9 is a flowchart illustrating another example of the processing in step S704 in FIG. 7.

FIG. 9 is a flowchart illustrating another example of the processing in step S704 in FIG. 7.

In this example, the priority status management unit 131 includes a counter for the number of transfers. The count value of the counter for the number of transfers is initialized to 0 at the time of the priority access type switching. Each time the access selection unit 132 selects and executes the access request of the priority access type, the count value is incremented by one. Similarly to the number of transfers, the priority status management unit 131 includes a counter for the transfer amount and a counter for the number of transfer cycles. The count value of the counter for the transfer amount is initialized to 0 at the time of the priority access type switching. Each time the access selection unit 132 selects and executes the access request of the priority access type, an effective transfer amount is added to the count value. The count value of the counter for the number of transfer cycles is initialized to 0 at the time of the priority access type switching. Each time the access selection unit 132 selects and executes the access request of the priority access type, the number of transfer cycles is added to the count value.

In step S901, the priority status management unit 131 determines whether the access request with the highest priority out of access requests stored in the access storage unit 110 is present in both the read access type and the write access type. If the priority status management unit 131 determines that the access request with the highest priority is present in either one of the read and write access types (NO in step S901), the processing proceeds to step S902. In contrast, if the access request with the highest priority is present in both read and write access types (YES in step S901), the processing proceeds to step S903.

In step S902, the priority status management unit 131 determines not to perform the priority access type switching. Then, the processing returns to the flowchart illustrated in FIG. 7.

In step S903, the priority status management unit 131 determines whether any one of the number of transfers, the transfer amount, and the number of transfer cycles after the priority access type switching is larger than or equal to respective threshold values. If any one of the counters for the number of transfers, the transfer amount, and the number of transfer cycles is larger than or equal to respective threshold values, the delay time in transferring an access request of a non-priority access type may possibly have increased. If the priority status management unit 131 determines that any one of the number of transfers, the transfer amount, and the number of transfer cycles after the priority access type switching is larger than or equal to respective threshold values (YES in step S903), the processing proceeds to step S904. In contrast, if the priority status management unit 131 determines that all of the number of transfers, the transfer amount, and the number of transfer cycles after the priority access type switching are smaller than respective threshold values (NO in step S903), the processing proceeds to step S902.

In step S904, the priority status management unit 131 determines to perform the priority access type switching. Then, the processing returns to the flowchart illustrated in FIG. 7.

Although, in the above-described example, the priority status management unit 131 is provided with a counter for the number of transfers, a counter for the transfer amount, and a counter for the number of transfer cycles, not all of these counters are required and at least one of these counters may be provided.

As described above, if the access request with the highest priority out of access requests stored in the access storage unit 110 is present in both the read and write access types, the priority status management unit 131 determines to perform the priority access type switching based on the number of transfers, the transfer amount, and the number of transfer cycles. If any one of the number of transfers, the transfer amount, and the number of transfer cycles after the switching is larger than or equal to respective threshold values, the priority status management unit 131 performs the priority access type switching. Thus, the present exemplary embodiment enables preventing an access delay by not performing the priority access type switching, to a further extent than the conventional memory control circuit.

Figure 10:
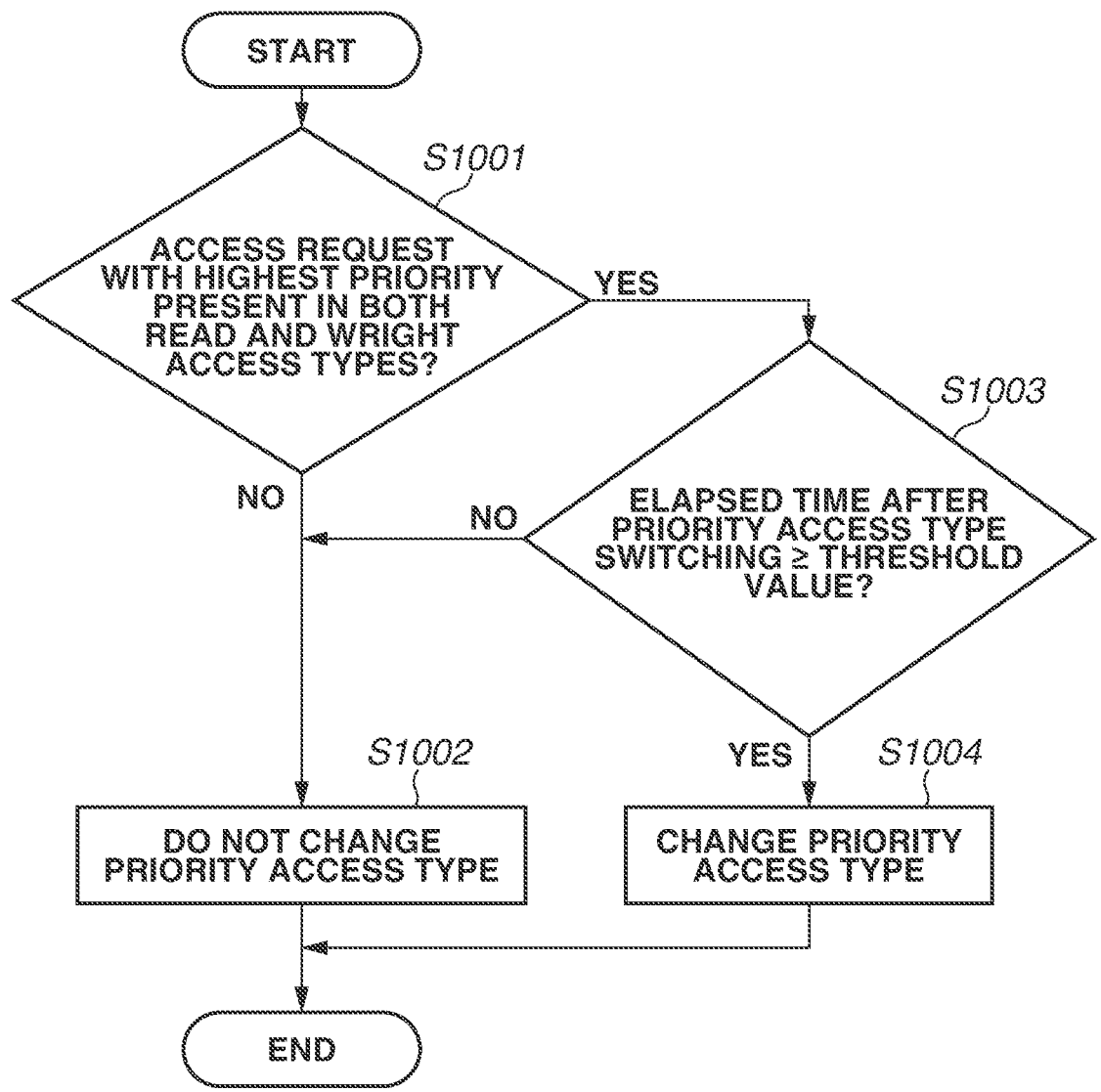
FIG. 10 is a flowchart illustrating still another example of the processing in step S704 in FIG. 7.

FIG. 10 is a flowchart illustrating another example of the processing in step S704 in FIG. 7.

In this example, the priority status management unit 131 is provided with a counter for the number of elapsed cycles. The count value of the counter for the number of elapsed cycles is initialized to 0 at the time of the priority access type switching. Each time one cycle is elapsed, the count value is incremented by one.

In step S1001, the priority status management unit 131 determines whether the access request with the highest priority out of access requests stored in the access storage unit 110 is present in both the read and write access types. If the priority status management unit 131 determines that the access request with the highest priority is present in either one of the read and write access types (NO in step S1001), the processing proceeds to step S1002. In contrast, if the priority status management unit 131 determines that the access request with the highest priority is present in both read and write access types (YES in step S1001), the processing proceeds to step S1003.

In step S1002, the priority status management unit 131 determines not to perform the priority access type switching. Then, the processing returns to the flowchart illustrated in FIG. 7.

In step S1003, the priority status management unit 131 determines whether the elapsed time after the priority access type switching is larger than or equal to a threshold value based on the count value of the counter for the number of elapsed cycles. In this case, the time period for one cycle is constant, and the number of elapsed cycles represents the elapsed time. If the number of elapsed cycles is larger than or equal to the threshold value, the delay time in transferring an access request of a non-priority access type may possibly have increased. If the priority status management unit 131 determines that the elapsed time after the priority access type switching is larger than or equal to the threshold value (YES in step S1003), the processing proceeds to step S1004. In contrast, if the priority status management unit 131 determines that the elapsed time after the priority access type switching is smaller than the threshold value (NO in step S1003), the processing proceeds to step S1002.

In step S1004, the priority status management unit 131 determines to perform the priority access type switching. Then, the processing returns to the flowchart illustrated in FIG. 7.

As described above, if the access request with the highest priority out of access requests stored in the access storage unit 110 is present in both the read and write access types, the priority status management unit 131 determines to perform the priority access type switching based on the elapsed time after the switching. If the elapsed time after the switching is larger than or equal to the threshold value, the priority status management unit 131 performs the priority access type switching. Thus, the present exemplary embodiment enables preventing an access delay by not performing the priority access type switching, to a further extent than the conventional memory control circuit.

The examples illustrated in FIGS. 8 to 10 may be suitably combined.

In step S304 in FIG. 3, the access selection unit 132 determines, upon execution of the access request of the priority access type, whether the access request of the priority access type after the switching can be executed without an execution timing delay, based on the bank status managed by the bank status management unit 123. The determination is not limited thereto, and the following determination may be performed.

In one example, the access selection unit 132 determines whether the access request of the priority access type does not require the issuance of an ACT command, based on the bank status managed by the bank status management unit 123. If the issuance of an ACT command is not necessary and the access request of the priority access type can be executed without a delay after the priority access type switching, the access selection unit 132 selects and executes the access request of the priority access type.

In other cases, the access selection unit 132 does not execute the access request. If the issuance of an ACT command is necessary, a PRE command or an ACT command may be delayed by the issuance of the ACT command in executing the access request of the priority access type after the priority access type switching. Thus, by determining that the issuance of an ACT command is not necessary, the access selection unit 132 can easily determine whether the access request of the priority access type can be executed without a delay after the priority access type switching. Thus, performance degradation due to a page miss of the memory 152 can be prevented to a further extent than the conventional memory control circuit.

As another example, the access selection unit 132 determines whether the bank for the access request of the priority access type is the same as the bank for the access request of the priority access type after the switching, based on the bank status managed by the bank status management unit 123. If the two banks are not the same, and the access request of the priority access type can be executed without a delay after the priority access type switching, the access selection unit 132 selects and executes the access request of the priority access type. In other cases, the access selection unit 132 does not execute the access request. If the two banks are the same, a PRE command or an ACT command may be delayed in executing the access request of the priority access type after the priority access type switching. Thus, by determining that the two banks are not the same, the access selection unit 132 can easily determine whether the access request of the priority access type can be executed without a delay after the priority access type switching. Thus, performance degradation due to a page miss of the memory 152 can be prevented to a further extent than the conventional memory control circuit.

As still another example, the access selection unit 132 determines whether the bank for the access request of the priority access type is to be refreshed, based on the bank status managed by the bank status management unit 123. If the bank for the access request of the priority access type is not to be refreshed, and the access request of the priority access type can be executed without a delay after the priority access type switching, the access selection unit 132 selects and executes the access request of the priority access type. In other cases, the access selection unit 132 does not execute the access request. If the bank for the access request of the priority access type is to be refreshed, a PRE command or an ACT command may be delayed in executing the access request of the priority access type after the priority access type switching. Thus, by determining that the bank for the access request of the priority access type is not to be refreshed, the access selection unit 132 can easily determine whether the access request of the priority access type can be executed without a delay after the priority access type switching. Thus, performance degradation due to a page miss of the memory 152 can be prevented to a further extent than the conventional memory control circuit.

Some embodiments can also be achieved when a program for implementing at least one of the functions according to the above-described exemplary embodiments is supplied to a system or apparatus via a network or storage medium, and at least one processor in a computer of the system or apparatus reads and executes the program. Further, some embodiments can also be achieved by a circuit (e.g., an application specific integrated circuit (ASIC)) for implementing at least one function.

The above-described exemplary embodiments are to be merely considered as illustrative in embodying the present disclosure, and are not to be interpreted as restrictive of the technical scope of the present disclosure. The present disclosure may be embodied in diverse forms without departing from the technical concepts or essential characteristics thereof.

The present disclosure makes it possible, at the time of the priority access type switching, to suitably execute an access request for a memory, thus preventing performance degradation of the memory.

While the present disclosure has described exemplary embodiments, it is to be understood that some embodiments are not limited to the disclosed exemplary embodiments. The scope of the following claims is to be accorded the broadest interpretation so as to encompass all such modifications and equivalent structures and functions.

This application claims priority to Japanese Patent Application No. 2021-068311, which was filed on Apr. 14, 2021 and which is hereby incorporated by reference herein in its entirety.

What is claimed is:

1. A memory control circuit comprising:
   a storage unit configured to store at least one access request for a memory;
   a first status management unit configured to, based on access requests stored in the storage unit, perform priority access type switching between two access types obtained by classifying the access requests; and an access selection unit configured to select and execute an access request stored in the storage unit, wherein the access selection unit performs:

if the priority access type switching is in progress and there is time for executing an access request of a priority access type before the priority access type switching, selecting the access request of the priority access type before the priority access type switching, and if the priority access type switching is not in progress, selecting an access request of the priority access type.

2. The memory control circuit according to claim 1, wherein the two access types obtained by classifying the access requests are an access request of a read access and an access request of a write access.

3. The memory control circuit according to claim 1, further comprising a second status management unit configured to manage a status of each bank of the memory, wherein, when the priority access type switching is in progress and the access selection unit determines, upon execution of the access request of the priority access type before the priority access type switching, that the access request of the priority access type after the priority access type switching can be executed without a delay, based on a bank status managed by the second status management unit, the access selection unit selects the access request of the priority access type before the priority access type switching.

4. The memory control circuit according to claim 1, further comprising a second status management unit configured to manage a status of each bank of the memory, wherein, at the time of the priority access type switching, when a time period before an issuance of a command of the access request of the priority access type after the priority access type switching, calculated based on a bank status managed by the second status management unit, is longer than a time period required to switch from an access type of the access request of the priority access type before the priority access type switching to an access type of the access request of the priority access type after the priority access type switching, the first status management unit determines that the priority access type switching is in progress.

5. The memory control circuit according to claim 3, further comprising:

an active selection unit configured to, in selecting and executing an access request stored in the storage unit, issue an active command for opening a bank according to the access request, based on the bank status managed by the second status management unit; and a precharge selection unit configured to issue a precharge command for closing a bank according to the access request.

6. The memory control circuit according to claim 1, wherein the access request is given a priority, and wherein, when the priority access type is different from the type of the access request with the highest priority out of the access requests stored in the storage unit, the first status management unit performs the priority access type switching.

7. The memory control circuit according to claim 6, wherein, when the storage unit stores access requests, and a time period before issuing a command of the access request of the priority access type is longer than a time period before issuing a command of an access request of a non-priority access type, the first status management unit performs the priority access type switching.

8. The memory control circuit according to claim 6, wherein, when either one of a number of transfers, a transfer amount, and a number of transfer cycles after the priority access type switching is larger than or equal to respective threshold values, the first status management unit performs the priority access type switching.

9. The memory control circuit according to claim 6, wherein, when an elapsed time after the priority access type switching is larger than or equal to a threshold value, the first status management unit performs the priority access type switching.

10. The memory control circuit according to claim 3, wherein, when the priority access type switching is in progress and an issuance of an active command is not necessary based on the bank status managed by the second status management unit, the access selection unit selects the access request of the priority access type before the priority access type switching.

11. The memory control circuit according to claim 3, wherein, when the priority access type switching is in progress and the bank for the access request of the priority access type is different from the bank for the access request of the priority access type after the priority access type switching, based on the bank status managed by the second status management unit, the access selection unit selects the access request of the priority access type before the priority access type switching.

12. The memory control circuit according to claim 3, wherein, when the priority access type switching is in progress and the bank for the access request of the priority access type is not to be refreshed, based on the bank status managed by the second status management unit, the access selection unit selects the access request of the priority access type before the priority access type switching.

13. The memory control circuit according to claim 1, wherein, when the priority access type switching is in progress and a type of the access request with a highest priority out of the access requests stored in the storage unit is different from the priority access type after the priority access type switching, the first status management unit stops the priority access type switching.

14. An information processing system comprising:

a processing unit configured to issue an access request to a memory; and a memory control circuit comprising:

a storage unit configured to store at least one access request for the memory;

a status management unit configured to, based on access requests stored in the storage unit, perform priority access type switching between two access types obtained by classifying the access requests; and an access selection unit configured to select and execute an access request stored in the storage unit, wherein the access selection unit performs:

if the priority access type switching is in progress, and there is time for executing an access request of a priority access type before the priority access type switching, selecting the access request of the priority access type before the priority access type switching, and if the priority access type switching is not in progress, selecting an access request of the priority access type, wherein the memory is configured to perform operation based on the access request from the memory control circuit.

15. A memory control method comprising:
storing at least one access request for a memory in a storage unit;
performing status management, based on access requests stored in the storage unit, for performing priority access type switching between two access types obtained by classifying the access requests; and
selecting and executing an access request stored in the storage unit,
wherein, in the selecting and executing the access request,
if the priority access type switching is in progress and there is time for executing an access request of a priority access type before the priority access type switching, the access request of the priority access type before the priority access type switching is selected, and
if the priority access type switching is not in progress, an access request of the priority access type is selected.

* * * * *